United States Patent
Maiti et al.

[11] Patent Number: 5,861,347
[45] Date of Patent: Jan. 19, 1999

[54] METHOD FOR FORMING A HIGH VOLTAGE GATE DIELECTRIC FOR USE IN INTEGRATED CIRCUIT

[75] Inventors: Bikas Maiti; Wayne Paulson; James Heddleson, all of Austin, Tex.

[73] Assignee: Motorola Inc., Austin, Tex.

[21] Appl. No.: 887,692

[22] Filed: Jul. 3, 1997

[51] Int. Cl.$^6$ .................................................. H01L 21/70
[52] U.S. Cl. ........................... 438/787; 438/787; 438/788; 438/773; 438/981; 438/257; 438/263; 438/264; 438/267; 438/211; 438/216; 438/119; 438/593; 148/DIG. 117; 148/DIG. 163
[58] Field of Search .................... 438/773, 981, 438/211, 216, 199, 257, 263, 264, 787, 788, 593, 594, 267; 148/DIG. 163, DIG. 117

[56] References Cited

U.S. PATENT DOCUMENTS

| | | | |
|---|---|---|---|
| 5,153,144 | 10/1992 | Komori et al. | 438/594 |
| 5,188,976 | 2/1993 | Kume et al. | 438/593 |
| 5,210,056 | 5/1993 | Pong et al. | 438/773 |
| 5,244,843 | 9/1993 | Chau et al. | 437/239 |
| 5,427,966 | 6/1995 | Komori et al. | 438/593 |
| 5,432,112 | 7/1995 | Hong | 438/593 |
| 5,502,009 | 3/1996 | Lin et al. | 438/275 |

*Primary Examiner*—Charles Bowers
*Assistant Examiner*—Thanh Nguyen
*Attorney, Agent, or Firm*—J. Gustav Larson; Keith E. Witek

[57] ABSTRACT

A method for form an integrated circuit device begins by growing a tunnel oxide (22). The tunnel oxide is exposed to a nitrogen containing ambient whereby nitrogen is incorporated at atomic locations at the interface between the tunnel oxide (22) and a substrate (11). This tunnel oxide and nitrogen exposure is performed for all of a floating gate active area (12), a high voltage active area (14) and a logic gate active area (16). A floating gate electrode (24) and interpoly dielectric regions (26 through 30) are then formed in the floating gate region (12). The tunnel oxide (22) is etched from the active areas (14 and 16) whereby nitrogen contamination (32) may remain. An optional sacrificial oxidation and a low temperature 830° C. wet oxidation process utilizing HCL, H2 and O2 is then used to grow a high voltage gate dielectric (34) which has been shown to improve charge to breakdown characteristics by a factor of 1,000. After the formation of the high voltage gate oxide (34), a lower voltage logic gate oxide (36) is then formed.

32 Claims, 3 Drawing Sheets

METHOD FOR FORMING A HIGH VOLTAGE GATE DIELECTRIC FOR USE IN INTEGRATED CIRCUIT

FIELD OF THE INVENTION

The present invention relates generally to semiconductor manufacturing, and more particularly to, forming a high voltage gate oxide for use in integrated circuits (ICs)

BACKGROUND OF THE INVENTION

The integrated circuit (IC) industry is continually striving to manufacture more robust gate dielectric materials for electrical devices. In the industry, advances in tunnel oxide formation and performance have been particularly desired. The tunnel oxide is typically the most-stressed oxide during electrical operation, and is typically a thin oxide of 90 angstroms or less in thickness. Due to its high level of stressing during operation and its thinness, the tunnel oxide needs to be made robust in order to improve integrated circuit (IC) yield and reliability. In order to improve the robustness of the tunnel oxide in a floating gate memory cell, the integrated circuit industry has exposed tunnel oxide gate dielectrics to a nitrogen-containing ambient. The nitrogen in this ambient provides nitrogen atoms which penetrate the tunnel oxide and chemically bond at the oxide-to-substrate interface whereby the tunnel oxide performance is improved.

However, the industry is continually striving to integrate more types of devices onto a single silicon substrate whereby the gate oxide optimization for one device may adversely effect another gate oxide for different device. The nitrogen exposure process which is used to form conventional tunnel oxides for floating gate structures, while enhancing the performance of tunnel oxides, will greatly degrade the stability and performance of other oxides subsequently formed in logic gate regions and high voltage regions on the same substrate.

The reason nitrogen anneals used for floating structures results in degradation of subsequently formed high voltage and low voltage gate oxides is due to the fact that the nitrogen is also incorporated into the logic and high voltage areas of the substrate as well as the tunnel oxide portions of the substrate. These nitrogen atoms, which are resident at the interface of the substrate and oxide, result in subsequent etch processing being complicated and less uniform. In addition, oxide growth from these nitrogen containing surfaces to form high voltage oxides and low voltage logic gate oxides will result in a substantially non-planar oxide surface which has increased electric fields and therefore, reduced breakdown resistance. In addition, the nitrogen atoms from the substrate may be incorporated into the bulk of subsequently-grown thermal gate oxides whereby trap sites are formed in the bulk of these oxide layers. The bulk trap sites can adversely effect leakage current between the gate and the substrate, may affect threshold voltage, and will also affect the breakdown voltage of the high voltage and logic device.

One method which can be utilized to remove impurities from a substrate before thermal oxidation is the use of a sacrificial oxide layer. A dry sacrificial oxide layer is grown on the surface of the substrate and then etched using a wet etch. The combination of the sacrificial oxidation process and the wet etching reduces impurities at the surface of the substrate where subsequent thermal oxidation is to occur. However, sacrificial oxides add an additional growth step and etch step to the process. Sacrificial oxides may increase the thermal budget of the overall process, and may not be able to remove all of the nitrogen contamination from the substrate whereby the planarity of the thermally grown oxide is affected and breakdown voltage is reduced. In addition, too many sacrificial oxide processes in one process flow will thin field oxide isolation regions or trench fill material whereby device-to-device isolation across the integrated circuit (IC) is adversely affected. Therefore, the use of dry sacrificial oxides alone is not comprehensive enough to completely remove all of the nitrogen-doping problems associated with highly integrated products which utilize floating gates with nitrogen doped tunnel oxides.

A process known as wet oxidation has been used in the art for the formation of logic gate structures. Wet oxidation, however, is viewed as disadvantageous since wet oxidation provides a faster growth rate, which tends to be harder to control, than dry oxidation which has become the industry standard for gate oxidation. In addition, wet oxidation may increase the number of traps in the oxide layer. There is currently no known data showing that any wet oxidation would improve the breakdown voltage of high voltage oxides grown in areas which have previously been exposed to nitrogen atoms. There is further no known literature stating that high voltage products can be manufactured using wet oxidation whereby nitrogen-exposed tunnel oxides can also be integrated with these high voltage devices at a high performance level.

Therefore, there is a need in the IC industry for a new gate oxidation process which can be easily integrated to form ICs containing one or more of logic devices and/or high voltage devices along with floating gate arrays. In addition, this new gate oxide process should have a reduced thermal budget, improved or maintained transistor breakdown voltage operation, and improved charge-to-breakdown (Qbd), whereby gate oxide planarity is improved (reducing electric field strength across gate oxide) and nitrogen doping in the bulk of the oxide is also reduced. Furthermore, this new oxidation process should be capable of being utilized without sacrificial oxide processing, whereby field oxide isolation is not adversely eroded.

Figure 1:
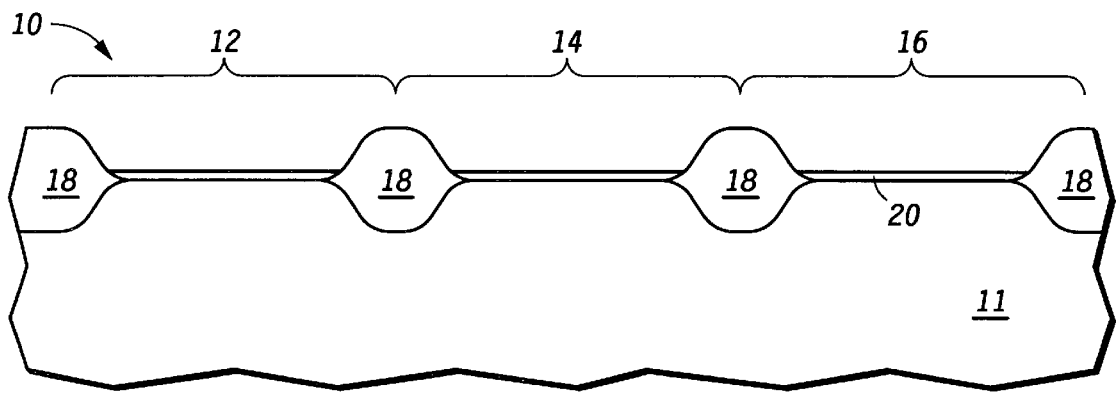
FIG. 1 illustrates a cross sectional view of a substrate having three active areas separated by isolation regions.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally, the present invention is a process for forming a nitrided tunnel oxide for a floating gate memory cell, a thicker gate oxide for a high voltage logic device, and a thinner gate oxide for use in logic arrays, all on a single integrated circuit (IC) substrate. The process begins by forming a tunnel oxide over a floating gate portion of the substrate. The tunnel oxide is exposed to a nitrogen-containing ambient to incorporate nitrogen in the tunnel-oxide-to-substrate interface to improve tunnel oxide reliability. However, this tunnel oxide formation and nitrogen doping will also occur in the logic gate areas and the high voltage circuitry areas of the substrate. It has been found that this incorporation of oxynitride materials or nitrogen atoms into these logic and high voltage portions of the substrate is disadvantageous since subsequent gate oxide growth in these regions has topographical roughness and nitrogen incorporation in the bulk of the grown oxides, which forms trap sites. The trap sites along with the non-planar surface of the oxide-silicon interface will significantly reduce the charge to breakdown, Qbd.

In the process taught herein, the oxynitride tunnel oxide material (a nitride) is removed from the high voltage areas of the substrate and the logic gate areas of the substrate. An optional sacrificial gate oxide process may be used after oxynitride removal to perform a pre-clean of the substrate surface before gate oxidation. An 830° C. wet oxidation having an ambient comprised of $O_2$, and $H_2$ is then used to grow a thick gate oxide over both the logic gate regions and the high voltage regions. It has been shown that the use of this 830° C. wet oxidation process has the unexpected benefit of increasing the charge to breakdown value (Qbd) between the high voltage gate electrode and the substrate by a factor of roughly 1,000, wherein dry oxidations and high temperature wet oxidations do not have this benefit.

After formation of this thicker high voltage gate oxide, the logic gate portion of the substrate is etched free of this thicker gate oxide and a thinner logic gate dielectric layer is formed by any conventional process. The final result is that an IC device is formed wherein the non-volatile floating gate devices, the high voltage logic devices, and the thin gate oxide logic devices reside on the same substrate. In this integrated IC device, the formation of the nitrogen doped tunnel oxide has not adversely affected the high voltage gate oxide regions or logic gate oxide regions.

The process taught herein will have a reduced thermal budget compared to the dry oxidation processes taught by the prior art due to reduced oxidation temperatures. In addition, the wet oxidation process uses oxygen and hydrogen, preferably in molecular form, at a temperature of less than 880° Celsius. At this temperature, it has been shown to improve the planarity of the thermally grown high voltage gate oxide while simultaneously reducing the nitrogen that is incorporated into the bulk of the high voltage gate oxide. The wet process taught herein for high voltage gate oxides also reduces problems due to residual nitrogen-related materials in the logic gate areas even if the high voltage wet gate oxide is totally removed from this area before logic gate oxide growth. Both this reduction of nitrogen in the bulk and the improved planarity of this thermally grown high voltage oxide has been shown to greatly improve charge to breakdown (Qbd) of the high voltage device by a factor of roughly 1,000. In general, the gate oxide taught herein allows for high voltage (5 volt–18 volt) operation without adverse breakdown effects. The process taught herein is easily integratable with other processes such that floating gate devices, high voltage devices, and logic gates may be readily manufactured on a single integrated circuit substrate with or without nitrogen doping of some of these gate oxides.

The invention can be further understood with reference to FIGS. 1–7.

FIG. 1 illustrates an integrated circuit device 10. Integrated circuit device 10 has a substrate 11. Substrate 11 is preferably a silicon wafer. However, substrate 11 can be gallium arsenide, a germanium-based substrate, silicon on insulator (SOI) material, and the like. Field oxide isolation regions 18 are illustrated as being formed over the surface of the substrate 11 in FIG. 1. Although FIG. 1 illustrates that the field isolation regions 18 are local oxidation of silicon (LOCOS) structures, other technologies such as shallow trench isolation (STI) or polysilicon encapsulated local oxidation of silicon (PELOX) could be used. In FIG. 1, the formation of field oxide isolation regions 18 creates a plurality of active areas across the surface of substrate 11. FIG. 1 specifically illustrates three such active areas 12, 14 and 16. A first active area 12 of FIG. 1 is an active area which will be used to form floating gate structures such as EEPROM memory cells, EPROM memory cells, and/or flash EEPROM memory structures. A second active area 14 in FIG. 1 is an active area which is used form high voltage transistors for I/O buffers and to form the logic which applies program and erase voltages to the floating gate arrays. A third active region 16 in FIG. 1 is a region which is used to form lower voltage transistors for high performance logic purposes, such as the formation of microcontroller core.

FIG. 1 also illustrates that a sacrificial oxide is formed overlying the three active areas 12, 14 and 16. The layer 20 is typically formed by dry oxidation at roughly 900° C. for roughly one hour. The sacrificial oxide 20 in FIG. 1 is grown to consume impurities at the top surface of the semiconductor substrate 11. In addition, crystalline silicon defects at the surface of the substrate 11 may be reduced by the formation of the sacrificial oxide 20. In addition, the layer 20 provides a screen oxide through which ion implantation can readily occur, and may also improve a planarity of the overall surface of the substrate. After formation of the sacrificial oxide layer 20, a wet chemistry is used to remove the sacrificial oxide from the surface of the substrate 11. It should be noted that a selective tunnel oxide area etch can be used as well.

Figure 2:
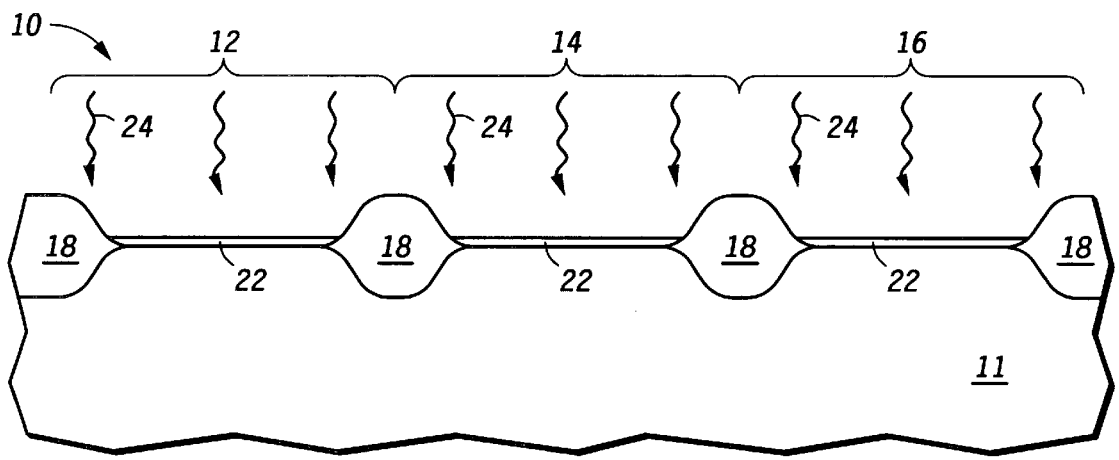
FIG. 2 illustrates in cross sectional view an oxide being formed on the substrate of FIG. 1.

FIG. 2 illustrates that a tunnel oxide layer 22 is formed after the removal of the sacrificial oxide 20 of FIG. 1. The tunnel oxide 22 is a thermally grown oxide formed via a dry or wet $O_2$ growth ambient. The oxide 22 is typically grown to a thickness of 90 angstroms or less which is required in order to enable sufficient electron tunneling. Either after formation of the oxide 22 or in situ during formation of the oxide layer 22, the oxide layer 22 is exposed to a nitrogen-containing ambient 24. The nitrogen-containing ambient 24 will provide atomic nitrogen, and like species, to the tunnel-oxide-to-substrate interface either through thermal diffusion or through ion implantation. Typically, the tunnel oxide 22 is placed in a furnace and exposed to one or more of $N_2$, NO, $NH_3$, or $N_2O$, with $N_2O$ being the preferred nitrogen carrier. The exposure of the oxide 22 to the nitrogen ambient 24 will result in nitrogen atoms being incorporated into the substrate-to-tunnel-oxide interface in all of the regions 12, 14 and 16.

Figure 3:
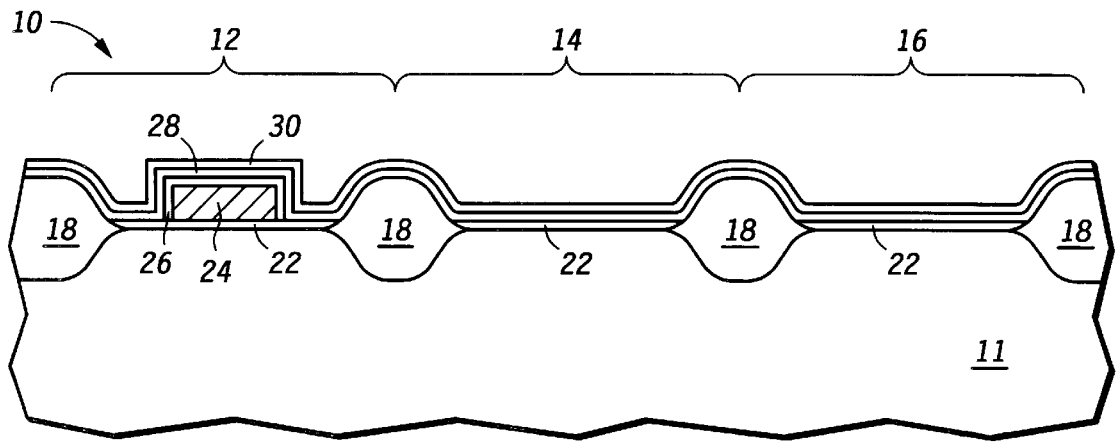
FIG. 3 illustrates in cross sectional view the substrate of FIG. 2 having a floating gate and an ONO layer.

In FIG. 3, a first layer of polysilicon is deposited overlying the substrate 11. This polysilicon layer may be insitu doped with phosphorus or like N-type dopant atoms or may be ion implanted with these impurities. This first layer of polysilicon is patterned and etched in a conventional manner in order to form a floating gate electrode 24 as illustrated in the active area 12 of FIG. 3. After formation of the floating gate structure 24, a thermal oxidation process or a chemical vapor deposition (CVD) step is used to form an oxide layer 26. The specific inter-polysilicon dielectric shown in FIG. 3 is an oxide-nitride-oxide (ONO) stack, however, dielectrics used in inter-polysilicon floating gate structures are typically comprised of thermal $SiO_2$, poly-oxide, silicon nitride, germanium oxide, germanium nitride, tetraethylorthosilicate (TEOS), and/or high temperature oxide of dichlorosilane and $N_2O$. A typical thickness of the oxide layer 26 is roughly 60–200 angstroms. After formation of the layer 26, a chemical vapor deposition (CVD) process is utilized to deposit a silicon nitride layer 28. A typical thickness of this silicon nitride layer 28 is roughly 60–150 angstroms. After formation of the nitride layer 28, a thermal oxidation process or a chemical vapor deposition step is then utilized to deposit a silicon dioxide ($SiO_2$) layer 30 over a top of the silicon nitride layer 28. A typical thickness of this layer 30 is roughly within the range of 20 angstroms to 100 angstroms. Collectively, the layers 26, 28 and 30 form an inter-polysilicon ONO layer which will lie between the floating gate 24 and a subsequently formed control gate of the floating gate structure in region 12.

Figure 4:
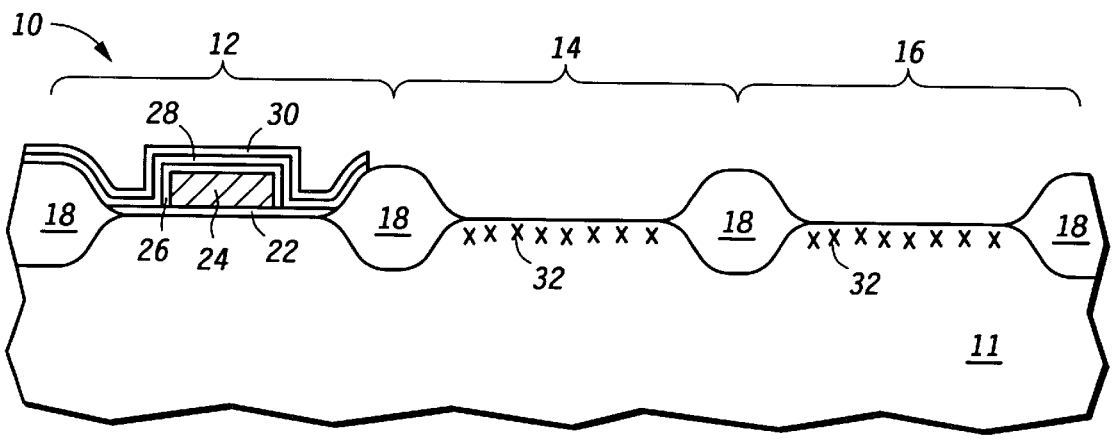
FIG. 4 illustrates in cross sectional view nitrogen contamination on the substrate following an etch process.

Conventional lithographic patterning and etch processing are then used to remove the ONO layers 26–30 from the active areas 14 and 16 as illustrated in FIG. 4. In addition, the nitrogen doped tunnel oxide 22 is also removed from the active areas 14 and 16 as illustrated in FIG. 4. It is important to note that the layer 22 comprises a significant nitrogen concentration at the interface to the substrate 11. The etch processing used to removed the oxide layer 22 is not optimized to fully remove the nitrogen-containing interface at the top surface of the substrate 11. Conventional and known oxide etches do not adequately etch nitrogen doped regions by design. Therefore, even after the etching of these layers of material 22, 26, 28, and 30, some nitrogen contamination 32 may still remain in the active areas 14 and 16. As previously discussed, any thermal oxidation process which is performed in regions 14 and 16 with the presence of these nitrogen contamination sites 32 will result in a non-planar gate oxide interface and nitrogen incorporation into the bulk of the thermal gate oxide. This non-planar surface and nitrogen bulk incorporation results in the charge to breakdown (Qbd) of the devices in regions 14 and 16 being adversely affected.

Therefore, an optional sacrificial gate oxide process similar to the sacrificial gate oxide process illustrated in FIG. 1 may be utilized again in FIG. 4 in an attempt to reduce some of the nitrogen contamination 32 at a surface of the substrate. In addition, the sacrificial gate oxide used at this step in the process may be grown using the process taught for the subsequent layer 34 as taught in FIG. 5. In other words, both the sacrificial oxide and the gate oxide 34 of FIG. 5 may be formed using a low temperature 830° C. wet oxidation comprising an ambient of $O_2$, and $H_2$. Therefore, the robust nitrogen removing properties of the wet oxide taught herein (in more detail in subsequent figures) can be utilized for sacrificial oxide steps to further the benefits of this process. Therefore, as long as a single wet oxidation step of regions 14 and 16 is performed either in a sacrificial capacity or in a gate oxide capacity will reduce nitrogen effects on the final gate oxide quality. In addition, it is further advantageous to use a subsequent thermal growth process, in addition to the sacrificial oxidation or in lieu of the sacrificial oxidation, to further provide the nitrogen-removing properties taught herein.

Figure 5:
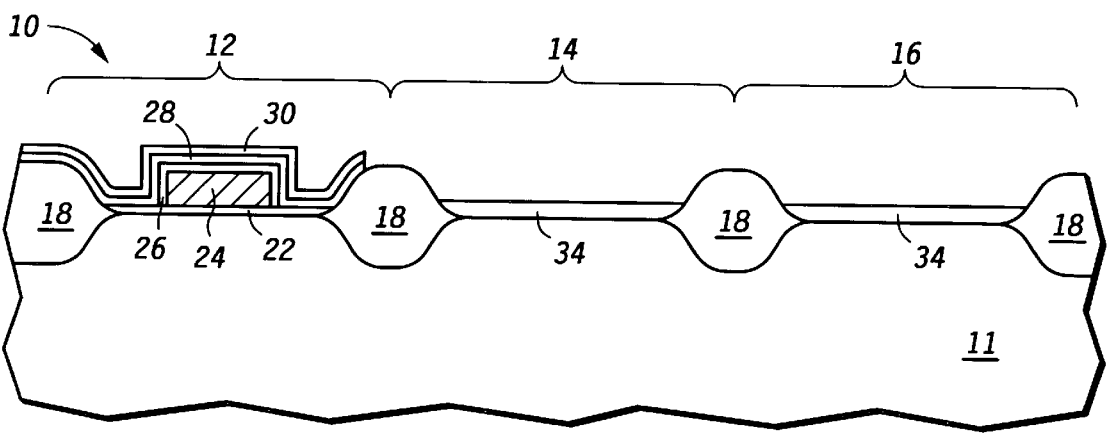
FIG. 5 illustrates in cross sectional view an oxide grown on the substrate.

FIG. 5 illustrates that a 220–350 angstrom thick wet oxide 34 is grown over the active areas 14 and 16. It should be understood that the thickness of the layer 34 could be any thickness greater than approximately 100 angstroms depending upon the high voltage application. In order to form the layer 34, the substrate is elevated to a temperature less than 880° C. and preferably to temperature of 830° C. While at this temperature, the substrate is exposed to $O_2$ and $H_2$. In a preferred form, the concentration of hydrogen to oxygen in this ambient is 60% to 40%. However, the ratio of hydrogen atoms to oxygen molecules can be anywhere within the range of 7:3 to 2:8 and will still result in at least some of the benefits taught herein.

It has been shown that the use of the 830° C. wet oxidation process, previously described as forming the layer 34, will result in a substantially planar thermal oxidation which is improved over the prior art. This more planar surface results in lower electric field strength and improves the charge to breakdown (Qbd) characteristics of transistors. Furthermore, nitrogen incorporation from the contamination 32 into the bulk of layer 34 has also been reduced. This reduction in nitrogen contamination reduces trap sites in the bulk of the oxide 34 whereby high voltage transistor performance is enhanced. In addition, the process taught herein uses a low temperature 830° C. wet process which improves a thermal budget over prior art higher-temperature dry gate oxidation processing. In addition to improved charge to breakdown operation and improved thermal budget, the transistors formed within the active area 14 can operate easily within the range of 5 volts to 18 volts without adverse effects. As can be seen via FIGS. 1–5, the process taught herein is easily integrated into microcontroller processes which contain floating gate structures, high voltage structures, and/or logic gate devices on an highly-integrated IC.

Furthermore, the oxide 34 has been shown to have the unexpected benefit of improving charge to breakdown (Qbd) characteristics of the high voltage devices by a factor of 1,000. It has further been shown that thermal oxidation of the layer 34 at a temperature of roughly 900° C. will not obtain this factor of 1,000 improvement in the charge to breakdown properties. Therefore, it is advantageous to perform this thermal oxidation below roughly 880° C. and specifically at below roughly 880° C. in order to achieve optimal thicknesses (250 angstroms –350 angstroms) while simultaneously achieving the extensive 1000× reduction in the adverse affects of the nitrogen presence. Conventional integrated circuit (IC) wisdom suggests that as oxidation temperature increases, the more improved the characteristics of the oxide will become. Therefore, the factor of 1,000 improve in the charge to break down characteristics of the gate oxide 34 is an unexpected benefit, and is contrary to conventional teachings in the integrated circuit (IC) art.

Figure 6:
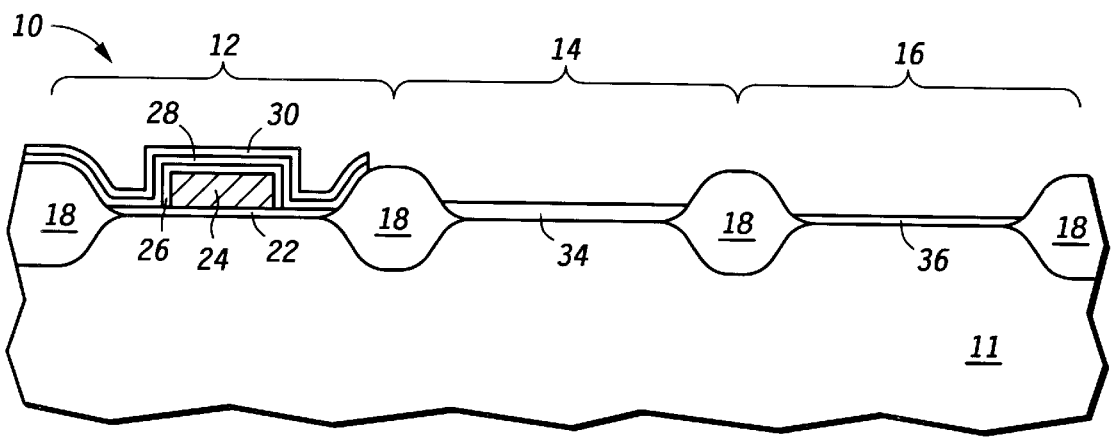
FIG. 6 illustrates in cross sectional view the substrate following removal and reformation of a portion of the gate dielectric.

FIG. 6 illustrates that conventional masking and etching processes are used to remove the thicker oxide 34 from the substrate portion 16. It is important to note that the contamination 32 illustrated previously in FIG. 4 will not now adversely effect the dry oxidation of the region 16 due to the previous oxidation of region 16 via layer 34 in FIG. 5. Due to the previous oxide 34 being formed over the region 16 in FIG. 5, the Qbd effects of the sites 32 of FIG. 4 have been reduced not only in the region 14, but also in the region 16 of FIG. 6 even after removal of the layer 34 in FIG. 6. Therefore, conventional dry oxidation processing can be utilized to form a thin (120 angstroms or less) gate dielectric region 36 in the logic gate portion 16 of FIG. 6 whereby oxide planarity and bulk incorporation of nitrogen into the gate oxide 36 is also improved as was the case for the oxide layer 34 of region 14.

Figure 7:
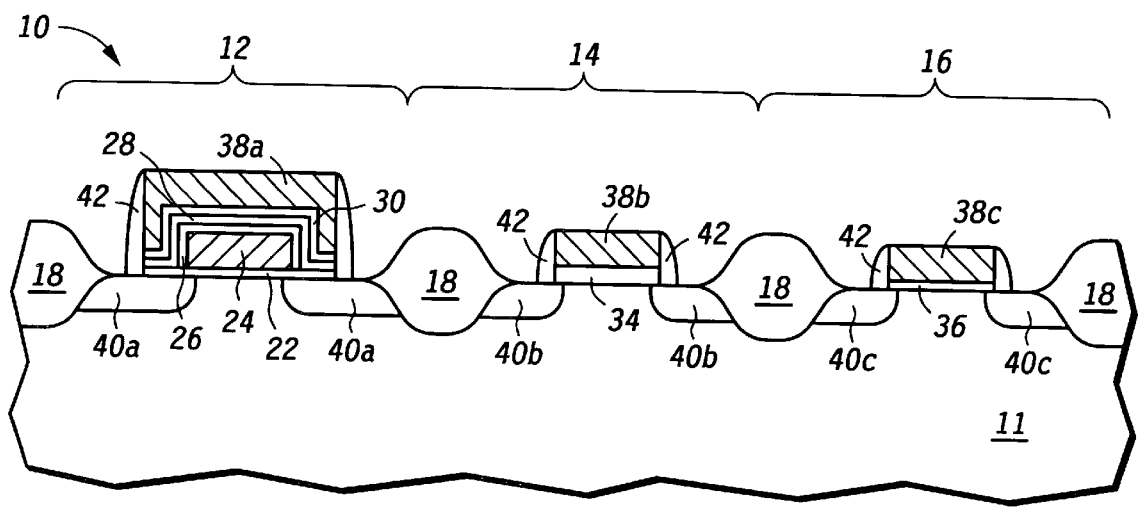
FIG. 7 illustrates in cross sectional view the substrate having a second gate structure.

FIG. 7 illustrates that a second polysilicon layer is deposited overlying the substrate 11. Conventional lithographic and etching processing is used to define a control gate 38a which overlies the floating gate 24, a high voltage control gate 38b which overlies a channel region within region 14, and a logic control gate 38c which lies within the logic gate region 16 of FIG. 7. After formation of the gates 38a–38c, a TEOS deposition is performed and a reactive ion etch is performed in order to form oxide sidewall spacers 42. In other forms, the sidewall spacers used to form source and drain regions can be silicon nitride or another type of dielectric or composite dielectric. In addition, lightly doped drain (LDD) regions can be formed herein. After formation of the spacers 42, an ion implantation or thermal diffusion step is used to form source and drain electrodes 40a–40c as illustrated in FIG. 7. After formation of the source and drain electrodes 40a–40c, conventional processing continues with the deposition or formation of both dielectric and conductive layers (e.g., overlying metal layers which couple to the transistors of FIG. 7) until final passivation is eventually formed. The integrated circuit (IC) device is then diced from the wafer and packaged in a final integrated circuit structure for end-use.

It is important to note that FIG. 7 specifically illustrates a non-self-aligned floating gate process. It is possible to form the floating gate devices in the active area 12 using a self-aligned floating gate and control gate process. Also, the ion implants used to form the source and drain regions may be used to dope the second layer of polysilicon 38a–38c to actively change the conductivity of these gate regions. Also, different ion implantation steps may be performed at different times that specifically illustrated herein. In other words, the implants into the region 12 may be totally different that the implants into one or more of the regions 14 and 16 via the use of ion implantation masking.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, the process taught herein may be used for either complementary metal oxide semiconductor (CMOS) processing or bi-CMOS processing. The process taught herein can be used to integrate logic devices with floating gate device, high voltage devices with floating gate devices, or integrate all three of logic devices, high voltage devices, and floating gate devices on a single IC. The term "oxynitride" or "nitride" is used herein. These terms are intended to mean any oxide or nitride which is contaminated with nitrogen whether at the substrate-to-oxide interface or within the oxide itself. It should be noted that various inert carrier gases such as Argon may be used for process flows as described herein. The process used herein may also be used to reduce undesirable effects associated with fluorinated oxides as opposed to nitrided oxides. The O2 and H2 wet growth environments taught herein may also include HCl. Therefore, it is intended that this invention encompass all of the variations and modifications as fall within the scope of the appended claims.

What is claimed is:

1. A method for forming a semiconductor device, the method comprising the steps of:

providing a semiconductor substrate having a substrate surface;

forming an oxide on the semiconductor substrate;

exposing the oxide to nitrogen in order to form a nitride;

forming a floating gate electrode over the nitride;

removing the nitride from a first region of the semiconductor substrate;

forming a wet grown oxide over first region substrate, wherein the wet grown oxide is formed in an ambient including hydrogen and oxygen; and forming a conductive gate over the wet grown oxide.

2. The method of claim 1, wherein the step of forming a wet grown oxide further comprises forming the wet grown oxide at a temperature of less than 880° Celsius.

3. The method of claim 1, wherein the step of forming a wet grown oxide further comprises forming the wet grown oxide at a temperature of less than approximately 840° Celsius.

4. The method of claim 1, wherein the step of forming a wet grown oxide further comprises forming the wet grown oxide at a temperature of approximately 830° Celsius.

5. The method of claim 1, wherein the step of forming a wet grown oxide further comprises the ambient including hydrogen molecules and oxygen molecules.

6. The method of claim 5, wherein the step of forming a wet grown oxide introduces a ratio of hydrogen molecules to oxygen molecules (H2:O2) in a range of 7:3 to 2:8.

7. The method of claim 5, wherein the step of forming a wet grown oxide introduces a ratio of hydrogen molecules to oxygen molecules (H2:O2) of approximately 6:4.

8. The method of claim 1, wherein the step of forming a wet grown oxide further comprises the ambient including hydrogen chloride.

9. The method of claim 1, wherein the step of forming a wet grown oxide further comprises the ambient including H2O steam.

10. The method of claim 1, further comprising the steps of:

forming an oxide layer on the substrate surface prior to forming the wet grown oxide; and removing the oxide layer prior to forming the wet grown oxide.

11. The method of claim 10, wherein the step of forming the oxide layer comprises:

forming the oxide layer in a wet environment containing oxygen molecules, hydrogen molecules, and HCl at approximately 830° Celsius.

12. The method of claim 1, further comprising the steps of:

forming a tunnel oxide region over a second region of the semiconductor substrate during the step of forming the nitride; and forming a floating gate over the second region prior to the step of removing the nitride.

13. The method of claim 1, further comprising the steps of:

removing the wet grown oxide from a second region of the semiconductor substrate prior to the step of forming a conductive gate;

forming a new oxide over the second region of the semiconductor substrate; and wherein the step of forming a conductive gate includes forming a conductive gate over the second region of the semiconductor substrate.

14. The method of claim 13, wherein the step of forming a new oxide includes the new oxide having a different thickness than the wet grown oxide.

15. The method of claim 1, wherein a thickness of the wet grown oxide is chosen to allow a transistor to operate with a gate voltage in a range of approximately 5 to 18 volts.

16. The method of claim 1, wherein a thickness of the wet grown oxide is approximately 100–350 wet oxide thickness.

17. A method for forming a semiconductor device, the method comprising the steps of:

provide a semiconductor substrate;

forming field isolation over the semiconductor substrate to form a first active region and a second active region;

forming an oxynitride in direct contact with the semiconductor substrate and over the first active region and the second active region;

forming a first conductive gate over the oxynitride in the first active region;

forming a dielectric layer over the first conductive gate;

removing the dielectric layer and oxynitride from the second active region following the step of forming the first conductive gate;

forming a wet grown oxide over the second active region, wherein the wet grown oxide is formed in an ambient including hydrogen and oxygen; and forming a second conductive gate over the first conductive gate and a third conductive gate in the second active region.

18. The method of claim 17 wherein the step of forming a second conductive gate over the first conductive gate comprises:

forming a device wherein the second conductive gate is a gate electrode for a non-volatile storage device, and the device including the third conductive gate is gate electrode for a high voltage logic device.

19. The method of claim 17 wherein the step of forming a second conductive gate over the first conductive gate comprises forming a device wherein the second conductive gate is used to form a non-volatile storage device the third conductive gate is used to form a logic device.

20. The method of claim 17, wherein the step of forming a wet grown oxide further comprises forming the wet grown oxide at a temperature of approximately 830° Celsius.

21. The method of claim 17, wherein the step of forming a wet grown oxide introduces a ratio of hydrogen molecules to oxygen molecules ($H_2:O_2$) of approximately 6:4.

22. The method of claim 17, wherein the step of forming a wet grown oxide further comprises the ambient including $H_2O$ steam.

23. The method of claim 17, further comprising the steps of:

forming a sacrificial oxide layer using a wet process prior to forming the wet grown oxide; and removing the sacrificial oxide layer prior to forming the wet grown oxide.

24. The method of claim 17, wherein a thickness of the wet grown oxide is chosen to allow a transistor to operate with a gate voltage in a range of approximately 5 to 18 volts.

25. A method for forming a semiconductor device, the method comprising the steps of:

providing a semiconductor substrate;

forming field isolation over the semiconductor substrate to form a first active region, a second active region, and a third active region;

forming an oxynitride over the first active region, the second active region, and the third active region;

forming a first conductive gate over the first active region and the oxynitride, the first conductive gate for functioning as a floating gate for a non-volatile cell;

forming a dielectric layer over the first conductive gate;

removing the oxynitride from the second active region and the third active region;

forming a wet grown oxide over the second active region and the third active region, wherein the wet grown oxide is formed in a wet oxidation ambient including hydrogen and oxygen;

removing the wet grown oxide over the third active region;

forming an oxide over the third active region; and forming a second conductive gate over the first conductive gate which functions as a control gate for the non-volatile cell, a third conductive gate in the second active region to form a gate for another logic devices, and a fourth conductive gate in the third active region.

26. The method of claim 25, wherein the step of forming a second, third and fourth conductive gate further comprises:

forming a non-volatile device using the second conductive gate;

forming a first logic device using the third conductive gate; and forming a second logic device using the fourth conductive gate, wherein the second logic device is for operating at a power supply voltage different than the first logic device.

27. The method of claim 26, wherein the first logic device is operates with a gate voltage in a range of approximately 5 to 18 volts.

28. The method of claim 26, wherein the second logic device is operates with a gate voltage in a range of approximately 0.9 to 5.0 volts.

29. The method of claim 25, wherein the step of forming a wet grown oxide further comprises forming the wet grown oxide at a temperature of approximately 830° Celsius.

30. The method of claim 25, wherein the step of forming a wet grown oxide introduces a ratio of hydrogen molecules to oxygen molecules (H2:O2) in a range of approximately 6:4.

31. The method of claim 25, wherein the step of forming a wet grown oxide further comprises the wet oxidation ambient including H2O steam.

32. The method of claim 25, further comprising the steps of:

forming a oxide layer using a wet process prior to forming the wet grown oxide; and removing the oxide layer prior to forming the wet grown oxide.

* * * * *